April 19, 1966 E. S. GILCHRIST 3,247,461

UNIVERSAL INSTRUMENTATION D.C. AMPLIFIER

Filed Dec. 9, 1960 4 Sheets-Sheet 1

INVENTOR
EDGAR S. GILCHRIST
by
Mason, Kolehmainen, Rathburn and Wyss
ATTORNEYS.

UNIVERSAL INSTRUMENTATION D.C. AMPLIFIER

Filed Dec. 9, 1960 4 Sheets-Sheet 2

INVENTOR
EDGAR S. GILCHRIST
by Mason, Kolehmainen, Rathburn and Wyss.
ATTORNEYS.

UNIVERSAL INSTRUMENTATION D.C. AMPLIFIER

Filed Dec. 9, 1960 4 Sheets-Sheet 3

INVENTOR
EDGAR S. GILCHRIST
by Mason, Kolehmainen, Rathburn and Wyss
ATTORNEYS

INVENTOR
EDGAR S. GILCHRIST
by
Mason, Kolehmainen, Rathburn and Wyss
ATTORNEYS.

United States Patent Office 3,247,461
Patented Apr. 19, 1966

3,247,461

UNIVERSAL INSTRUMENTATION D.C. AMPLIFIER

Edgar S. Gilchrist, Fairfield, Conn., assignor, by mesne assignments, to Consolidated Electrodynamics Corporation, Pasadena, Calif., a corporation of California

Filed Dec. 9, 1960, Ser. No. 75,461
8 Claims. (Cl. 330—9)

Figure 1:
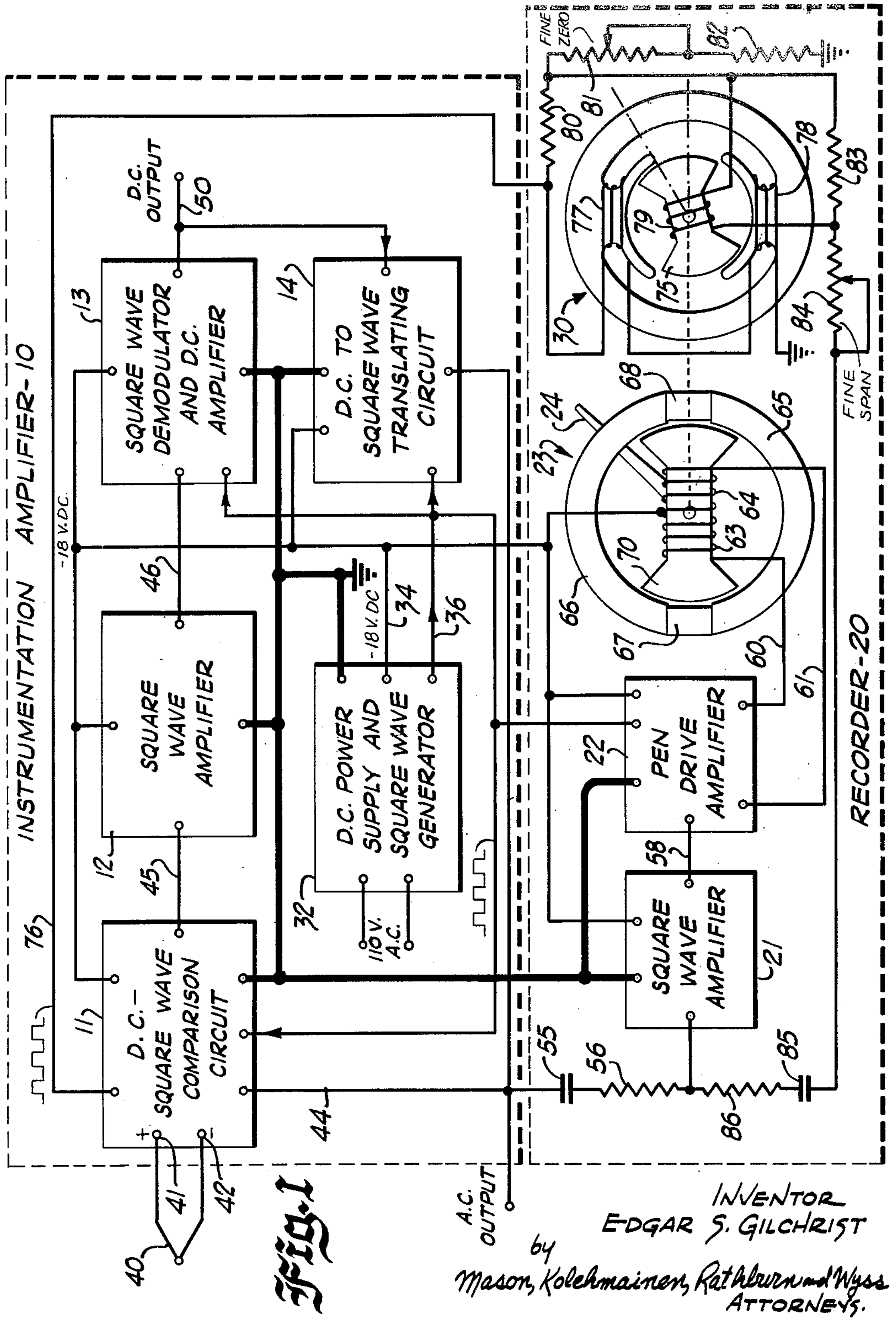

The present invention relates to instrumentation amplifiers, more particularly, to electronic amplifiers which are arranged to amplify an electrical input signal to a level suitable to function with a process control instrument such as a recorder or indicator. Specifically, the present invention is directed to an instrumentation amplifier which is arranged to receive an electrical input signal and is adapted to provide either a D.C. output signal or an A.C. output signal of a level suitable to drive a recording, indicating or other process control instrument.

In many instances it is necessary to provide an instrumentation amplifier in which the input and output circuits are isolated insofar as D.C. voltages are concerned. This is because the measuring instrument, which may comprise a thermocouple, resistance bulb or strain gage, many times develops in addition to the desired voltage between its output terminals an undesired voltage between one or both of these terminals and ground or other reference point. These undesired signals, which may be intermittent in nature, may comprise a 60 cycle alternating current, or may be ground currents due to some other machinery in the vicinity, should not appear in the output of the instrumentation amplifier even though the amplifier is designed to provide a D.C. output signal.

If the instrumentation amplifier is of the potentiometer type wherein the D.C. input signal is compared with the D.C. output signal, additional difficulties arise if, at the same time, D.C. isolation between the input and output circuits is to be achieved. Certain arrangements heretofore proposed have employed a balanced feedback arrangement so that the output does not respond to the undesired voltage components of the input signal. Other arrangements have employed two tandem connected amplifiers, the first of which is a potentiometer type of amplifier and the second of which provides a current balancing arrangement to develop the desired D.C. output signal. In these latter arrangements it is necessary to employ an isolated or so-called floating power supply for the first amplifier, since this power supply is directly connected to the measuring instrument. Normally, an electrostatic shield is employed which surrounds the entire input amplifier and its isolated power supply, this shield being connected to the measuring instrument so that no amplification of the undesired voltage components of the measuring instrument is produced. In such an arrangement the electrostatic shield must be connected to ground at the source of noise, which is, in many instances, inconvenient.

It is, therefore, an important object of the present invention to provide a new and improved instrumentation amplifier which is capable of receiving an electrical input signal from a measuring instrument at low level and develops either a proportional direct current output signal or a proportional alternating current output signal which is at a suitably high level to operate a succeeding process control instrument such as a recorder or indicator.

It is another object of the present invention to provide a new and improved instrumentation amplifier in which D.C. isolation is provided between the input and output of the amplifier without employing isolated power supplies or electrostatic shields around the input stage of the instrumentation amplifier.

It is a further object of the present invention to provide a new and improved instrumentation amplifier which is adapted to receive a low level D.C. input signal and develops either a D.C. or A.C. output signal of high level while providing a potentiometer type of amplification wherein the input and output signals are continuously compared with one another.

It is a still further object of the present invention to provide a new and improved instrumentation amplifier of the potentiometer type wherein the output of the amplifier is compared to the input signal applied thereto and wherein both the input and output signals are D.C. while at the same time providing D.C. isolation between the input and output circuits of the amplifier.

A further object of the present invention resides in the provision of a new and improved instrumentation amplifier which provides either a D.C. or an A.C. output signal in response to a low level input signal with D.C. isolation between the input and output circuits, which employs transistor circuitry, is of extremely rugged construction and of low power consumption.

In many process control applications, it becomes necessary to calibrate the instrumentation amplifier to measuring instruments having different spans and having different zero calibration points. For example, under certain conditions an instrumentation amplifier may be called upon to produce an output signal which varies over a given range of, for example, from —.4 volt to —2.0 volts when the process temperature varies from 30° C. to 40° C., i.e., a span of 10° C. This means that the instrumentation amplifier must produce its minimum output signal of —.4 volt when the measuring thermocouple is producing a predetermined electrical signal at 30° C. and should produce its maximum output signal of —2.0 volts when the thermocouple is producing a different electrical signal at 40° C. On the other hand, the instrumentation amplifier may under other conditions be called to produce an output signal range of from —.4 volt to —2.0 volts in response to a temperature variation of from 30° C. to 100° C. Under these latter conditions the input span is 70° C. whereas under the first set of conditions the input span was 10° C. Calibration of the instrumentation amplifier to these different span requirements is conventionally made by employing different sets of precision valued resistors and in many instances these resistors must be especially selected to provide the required calibration to particular span requirements. Also, it is necessary in many instances to vary the zero calibration point of the instrumentation amplifier. Thus, it may be desirable to measure a ten degree span starting with 0° C. in one instance whereas it is desirable to measure a ten degree centigrade span starting from 100° C. in another application. Zero suppression is also conventionally accomplished by the use of precision resistors which are substituted to obtain the desired zero suppression calibration.

It is, therefore, a further important object of the present invention to provide a new and improved instrumentation amplifier wherein the span of the instrument may be readily varied in a simple and economical manner to adapt the amplifier to different input span requirements.

It is another object of the present invention to provide a new and improved instrumentation amplifier wherein the amplifier may be calibrated to different input span requirements without employing different values of resistors for calibration purposes.

It is a further object of the present invention to provide a new and improved instrumentation amplifier wherein the amplifier may be inductively calibrated to different input span requirements.

Another object of the present invention resides in the provision of a new and improved instrumentation amplifier wherein the amplifier may be calibrated to different input span requirements by merely varying the number of turns of a transformer winding, and without varying the values of any resistive components of the amplifier.

It is another object of the present invention to provide a new and improved instrumentation amplifier which may be readily calibrated for zero suppression and span by simply varying the number of turns of individual span and zero suppression transformer windings.

It is a still further object of the present invention to provide a new and improved instrumentation amplifier which is so arranged that each loop or turn of wire on a transformer winding represents a predetermined millivolt range of input span and the span of the instrument may be readily varied by changing the number of turns on said transformer winding.

Briefly, in accordance with one aspect of the invention, the input signal from the measuring instrument, such as a thermocouple, is compared with the peak to center amplitude of a feedback square wave signal having equal duration half cycles in an input circuit which employs transistor circuitry which is controlled so that the comparison is only made during predetermined half cycles of the feedback square wave. This transistor circuitry is such that an extremely low impedance switching is provided so that no floating power supplies are required for the input comparison circuit although this circuit is isolated from the remainder of the instrumentation amplifier by transformer coupling. A square wave error signal is produced in the input comparison circuit which, after suitable amplification, is demodulated to provide a D.C. output which is isolated from the D.C. input signal and is of relatively high level. The D.C. output signal is then translated into a square wave signal the peak to peak value of which is exactly equal to the D.C. output signal and this square wave signal can be used as an A.C. output signal to operate a suitable recording or indicating instrument. In addition, this square wave signal is utilized as a suitably phased feedback square wave which is applied back to the input comparison circuit and compared with the D.C. input signal as mentioned heretofore. The turns ratio of the feedback transformer which supplies the feedback square wave signal to the input comparison circuit is so chosen that each turn of the winding of this transformer which is included in the input comparison circuit represents a predetermined millivolt input span of the instrumentation amplifier. Accordingly, the instrumentation amplifier may be readily calibrated to different span conditions by merely changing the number of turns on the feedback transformer and without changing any resistive components in the circuit. In order to provide for suppressed zero calibration, a highly regulated square wave of fixed amplitude is coupled through a further coupling transformer to the input comparison circuit and this further square wave component, which is suitably phased with respect to the feedback square wave signal, is added to the feedback square wave for comparison purposes. By varying the number of turns of the winding on the zero suppression coupling transformer which is included in the input comparison circuit, the zero suppression point of the instrumentation amplifier may be readily varied without changing any of the resistive components of the circuit. In addition, cold junction compensation of the thermocouple is achieved by developing a further square wave signal in the input comparison circuit which varies in amplitude in accordance with temperature variations and provides cold junction compensation for the instrumentation amplifier.

Figure 2A:
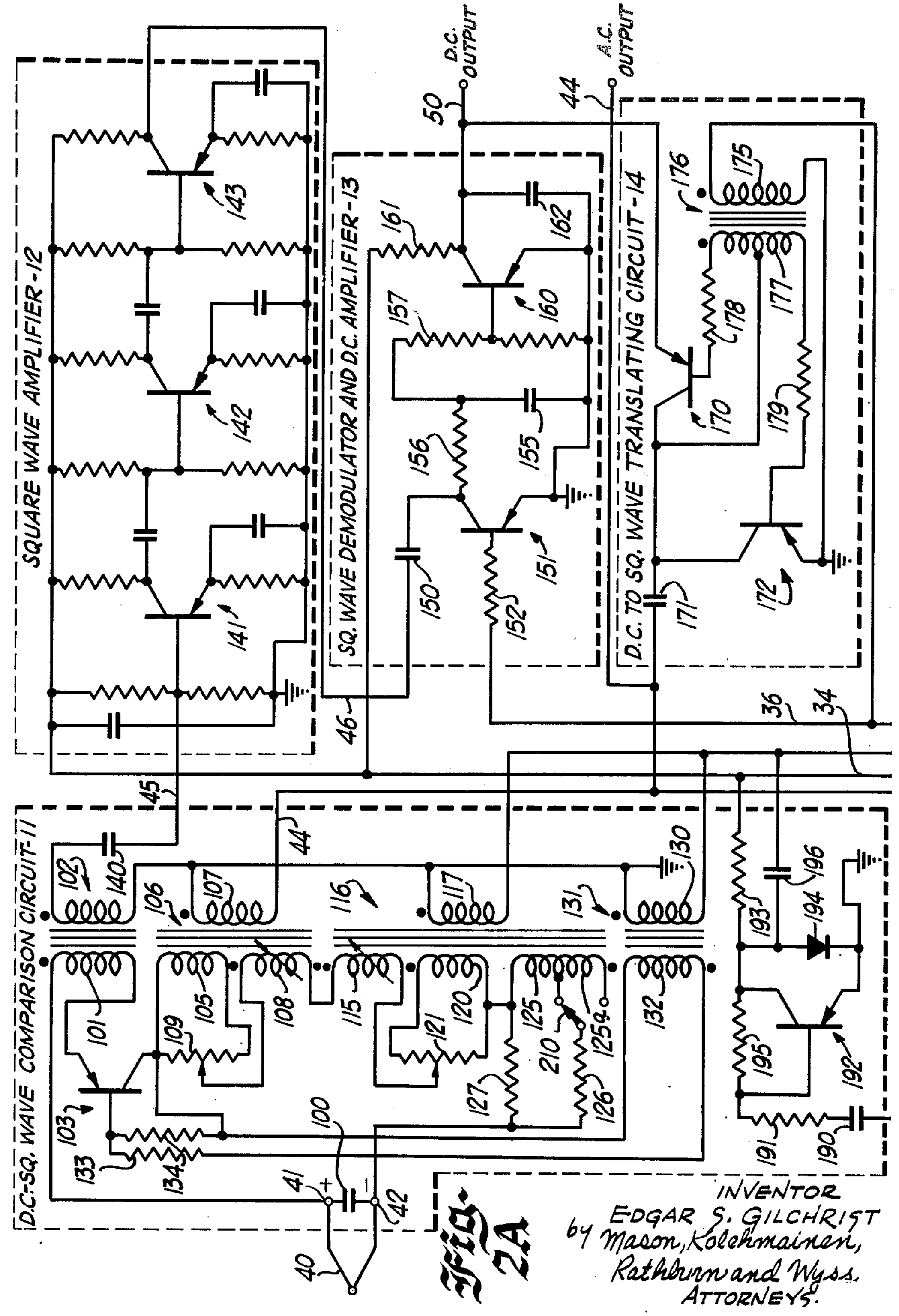
Figure 2B:
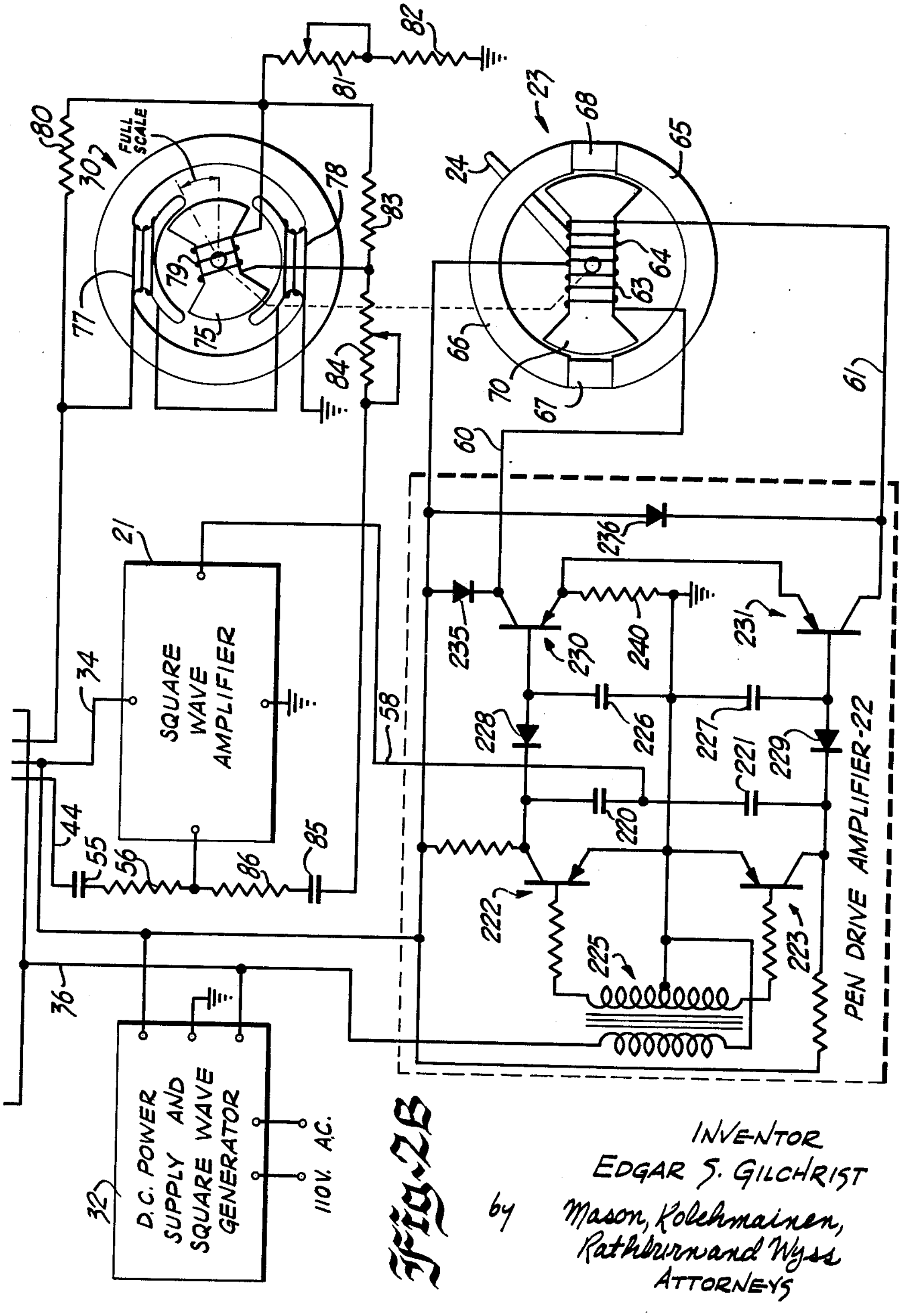

The invention, both as to its organization and method of operation, together with further objects and advantages thereof, will best be understood by reference to the following specification taken in connection with the accompanying drawings in which:

FIG. 1 is a block diagram of an instrumentation amplifier which embodies the principles of the present invention shown in conjunction with a suitable electronic recorder arrangement;

FIGS. 2A and 2B, when placed one above the other with FIG. 2A at the top, show a detailed schematic diagram of the instrumentation amplifier and recorder arrangement of FIG. 1; and FIGS. 3A to 3J, inclusive, are timing diagrams of the waveforms produced at various points in the circuit of FIGS. 2A and 2B.

While the instrumentation amplifier of the present invention is of general application in supplying either an A.C. or a D.C. output signal of relatively high level in response to a low level input signal, the instrumentation amplifier will be described in conjunction with a recorder arrangement which is adapted to function properly with an alternating current output signal from the instrumentation amplifier.

Referring now to the drawings, and more particularly to FIG. 1 thereof, the instrumentation amplifier of the present invention is therein illustrated as the instrumentation amplifier 10 which consists of a D.C. square wave comparison circuit 11, a square wave amplifier 12, a square wave demodulator and D.C. amplifier 13, and a D.C. to square wave translating circuit 14. In the illustrated embodiment the A.C. output of the instrumentation amplifier 10 is applied to a recorder 20 which comprises a square wave amplifier 21, a pen drive amplifier 22, a pen motor indicated schematically at 23, which is employed to drive a recording pen or indicating pointer 24 and a position translating unit indicated generally at 30, which is mechanically connected to the shaft of the motor 23 and is employed to develop a feedback signal which indicates the position of the pen or pointer 24. A D.C. power supply 32 is employed to develop a suitable unidirectional voltage on the conductor 34 for all of the component units of the amplifier 10 and the recorder 20, this power supply also functioning to develop a square wave on the output conductor 36 thereof which is employed as a reference or control wave in various components of the instrumentation amplifier 10 and the recorder 20.

Considering first the general operation of the component units of the instrumentation amplifier 10, the input signal which is developed by the primary measuring element, such as the illustrated thermocouple 40, is supplied to the input terminals 41 and 42 of the input comparison circuit 11. The input circuit 11 compares the value of the D.C. voltage developed by the thermocouple between the input terminals 41 and 42 with the peak to center amplitude of a feedback square wave signal which is supplied from the translating circuit 14 by way of the conductor 44, after this feedback square wave has been suitably stepped down by means of a feedback transformer in the comparison circuit 11. The difference between the thermocouple output and the peak to center amplitude of the feedback square wave signal appears as a suitably phased square wave on the conductor 45 and is supplied to the square wave amplifier 12 wherein it is substantially amplified in magnitude and is coupled by way of the conductor 46 to the square wave demodulator and D.C. amplifier 13. The circuit 13 is supplied with the reference square wave signal developed by the square wave generator in the power supply 32 by way of the conductor 36 and functions to develop a D.C. voltage of relatively high level on the output conductor 50 which may be employed as the D.C. output of the instrumentation amplifier 10 in the event that the succeeding process control instrument is to be actuated by a unidirectional voltage signal. In the illustrated embodiment the voltage produced on the output conductor 50 will vary from −0.4 volt at minimum scale to −2.0 volts as full scale for a predetermined input millivolt span from the thermocouple 40. The translating circuit 14 functions to translate the D.C. voltage appearing on the conductor 50 into a square wave having a peak to peak value exactly equal to the D.C. voltage on the output conductor 50, this translated square wave being fed back by way of the conductor 44 to the comparison circuit 11 where, as described heretofore, it is compared with the input signal developed by the thermocouple 40.

The square wave output of the translating circuit 14 may also be used as the output of the instrumentation amplifier 10 and in the illustrated embodiment this square wave signal is applied to the recorder 20. More particularly, the square wave signal appearing on the conductor 44 is supplied through a coupling condenser 55 and a mixing resistor 56 to the input of the square wave amplifier 21 wherein it is compared with a square wave developed by the position translating circuit 30 which represents pen position. The resultant error signal is amplified in the amplifier 21 and is supplied over the conductor 58 to the pen drive amplifier 22. The amplifier 22 is supplied with the reference square wave signal developed on the conductor 36 in the power supply 32 and functions to translate or demodulate the square wave error signal and provides a modified push-pull D.C. output on the conductors 60 and 61 which are supplied to the opposed rotor windings 63 and 64 on the soft iron rotor 70 of the motor 23. The stator of the motor 23 may comprise semi-cylindrical laminated members 65 and 66 which are polarized by the permanent magnets 67 and 68 so that a permanent magnet field is set up across the rotor 70 of the motor 23. Accordingly, the rotor 70 aligns itself with respect to the permanent magnet field set up by the stator magnets and in the absence of any unbalance in the voltages on the conductors 60 and 61 the rotor 70 occupies the midposition shown in FIG. 1 in which position the pen 24 is at mid scale. The rotor is moved away from this midposition in response to a voltage of the proper polarity on either the conductor 60 or the conductor 61 and the pen 24 follows movement of the rotor, as will be readily understood by those skilled in the art. Accordingly, the pen arm 24 assumes a position proportional to the magnitude of the input square wave derived from the instrumentation amplifier 10 by way of the conductor 44.

The rotor 75 of the position translating unit 30 is mechanically connected to the rotor 70 of the motor 23 so that the rotor 75 is moved to a position corresponding to the recorder pen 24. A reference square wave signal which is highly regulated and of substantially constant amplitude is developed in the input comparison circuit 11 of the instrumentation amplifier 10 and is supplied by way of the conductor 76 to the series aiding stator windings 77 and 78 of the translating unit 30. Accordingly, a square wave feedback signal is developed in the rotor winding 79 which has an amplitude proportional to the position of the rotor 75 with respect to the stator of the unit 30. The square wave reference signal is also applied to the series combination of a resistor 80, a potentiometer 81 and a resistor 82 so that a square wave of constant amplitude is developed between the junction of the resistor 80 and the potentiometer 81 and the common or ground potential point. The square wave produced at the junction of the resistor 80 and the potentiometer 81 is employed for zero adjustment of the recorder 20 and is continuously produced irrespective of the position of the rotor 75, the value of this zero adjustment square wave being variable by means of the potentiometer 81. The zero adjustment square wave produced across the potentiometer 81 and the resistor 82 is added in series with the square wave signal produced across the winding 79 of the position translating device 30, a shunting resistor 83 being connected across the rotor winding 79 to provide the correct relationship between the zero adjustment square wave and the feedback position representing square wave. The square wave produced across the rotor 79 and the zero adjustment square wave are coupled through a fine span adjustment potentiometer 84, a coupling condenser 85 and a mixing resistor 86 to the input of the square wave amplifier 21. By adjustment of the potentiometer 84 the span of the recorder 20 may be calibrated to the output signal from the instrumentation amplifier 10.

Considering now the manner in which the above described functions are accomplished in the detailed circuit arrangement shown in FIGS. 2A and 2B, a large bypass condenser 100 is connected between the input terminals 40 and 41 of the comparison circuit 11 so as to remove any A.C. components which may appear between the thermocouple input leads. The positive input terminal 41 is connected to the upper end of the primary winding 101 of an error output transformer 102, the bottom end of this winding being connected to the emitter of a transistor 103, the transistor 103 being employed as a synchronized electronic switch, as will be described in more detail hereinafter. The collector of the transistor 103 is connected to the upper end of a fine span adjustment winding 105 of a feedback transformer 106, the feedback square wave which is impressed upon the conductor 44 from the translating circuit 14 being applied to another winding 107 of the transformer 106. The transformer 106 is also provided with a coarse span adjustment winding 108, the number of turns of which may be varied to calibrate the instrumentation amplifier to different input span requirements, as indicated diagrammatically by an arrow through the transformer winding 108. A span adjustment potentiometer 109 is connected across the winding 105 and the arm of the potentiometer 109 is connected in series with the winding 108. The square wave impressed upon the winding 107 is induced in both of the windings 105 and 108 in an amplitude which is a direct function of the turns ratios of the winding 107, and the windings 105 and 108 and the two square waves appearing across the windings 105 and 108 are additively connected in series to the collector of the transistor 103.

The bottom end of the winding 108 is connected to a winding 115 on a zero suppression and cold junction compensating transformer 116, the transformer 116 having a winding 117 thereon to which is supplied a reference square wave of highly regulated and substantially constant amplitude which is derived from the square wave produced on the conductor 36 in the power supply 32, as will be described in more detail hereinafter. The polarity and number of turns on the winding 115 are arranged to be varied for zero suppression purposes, as indicated by the arrow in FIG. 2A, and the amplitude of the square wave produced across the winding 115 will be directly related to the amplitude of the square wave impressed across the winding 117, as determined by the turns ratio between these two windings. A fine zero suppression winding 120 is provided on the transformer 116 across which a square wave is developed of an amplitude proportional to the turns ratio between the windings 117 and 120, a potentiometer 121 being connected across the winding 120 so that any desired proprotion of the square wave produced across this winding may be selected, the arm of the potentiometer 121 being connected to the bottom end of the winding 115 so that the square waves produced across the windings 115 and 120 are connected in series with the square waves produced across the windings 105 and 108 of the transformer 106 to the collector of the transistor 103.

The transformer 116 is also provided with a cold junction compensation winding 125 across which a square wave is developed in proportion to the turns ratio between the winding 117 and 125. A voltage divider consisting of a resistor 126, which is preferably made of a material such as manganin having a substantially zero temperature coefficient, and a resistor 127 which is preferably made of a material having a positive temperature coefficient of resistivity such as copper, is connected across the winding 125 so that a portion of the square wave developed across the winding 125 appears across the resistor 127 of an amplitude proportional to the relative resistances of the resistors 126 and 127.

From the foregoing, it will be seen that a number of square wave signals developed by the above described windings of the transformers 106 and 116 are serially combined between the collector of the transistor 103 and the negative terminal 42 of the comparison circuit 111. All of these square wave signals, which may be of different phases for reasons to be described in more detail hereinafter, are additively combined so that the collector of the transistor 103 swings positively and negatively with respect to the potential of the terminal 42 by an amount equal to the sum of the amplitudes of the individual square waves described above. The transistor 103 is rendered highly conductive during the positive half-cycle portions of the composite square wave applied to its collector so that during the positive half cycle portions of this composite square wave the peak to center amplitude of the composite square wave is compared with the thermocouple voltage produced across the terminals 41 and 42. To this end, the highly regulated square wave of constant amplitude which is supplied to the winding 117 of the transformer 116 is also supplied to a winding 130 on a separate switching transformer 131, the transformer 131 being provided with another winding 132 across which is connected a voltage divider comprising the resistors 133 and 134. The square wave voltage thus produced across the resistor 134 is 180° out of phase with the composite square wave applied to the collector of the transistor 103 is applied between the base and collector of the transistor 103 to forward bias the collector-base function so that this transistor acts as an electronic switch and provides a very low impedance path between the emitter and collector of the transistor 103, it being noted that the transistor is operated in its so-called inverted form so that a relatively small voltage drop is produced between the emitter and collector of this transistor, in the order of one millivolt, when is it rendered fully conductive by the switching square wave.

When the transistor 103 is thus rendered highly conductive during the negative half cycles of the switch waveform, the voltage is produced across the winding 101 of the output transformer 102 which is a square wave having an amplitude proportional to the difference between the D.C. voltage produced between the terminals 41 and 42 by the thermocouple and the positive peak to trough or center value of the composite square wave applied to the collector of the transistor 103. In the illustrated embodiment and with the transformer polarities shown in the drawing, the peak to center value of the composite square wave is chosen just slightly larger than the thermocouple voltage produced between the terminals 41 and 42 so that a negatively phased square wave error signal is produced in the winding 101. This square wave error signal is coupled through the transformer 102 in the same phase and is transmitted through a coupling condenser 140 and over the conductor 45 to the first transistor amplifier 141 in the square wave amplifier 12.

The transistor amplifier 141 is of conventional design and is provided with a suitable emitter bias circuit so that the square wave impressed upon the base electrode thereof is repeated in amplified form but with reversed polarity at the collector of the transistor 141. In a similar manner the square wave error signal is further amplified in a succeeding transistor amplifier 142 and is then amplified still further in the last transistor amplifier 143 so that there is produced at the collector of the transistor 143 a relatively large amplitude error square wave having a polarity which is reversed from that of the square wave produced on the conductor 45.

In accordance with an important feature of the invention the amplified error signal is not employed directly as the square wave input signal which is supplied to the winding 107 of the feedback transformer 106, but instead the amplified error signal is first converted to a D.C. voltage of corresponding amplitude and this D.C. voltage is further amplified and used as the D.C. output of the instrumentation amplifier. The D.C. output voltage is then translated back into a square wave signal having very flat top portions and steep sides and this square wave signal is employed both as the A.C. output of the instrumentation amplifier and as the feedback signal which is applied to the winding 107. With this arrangement the wave shape of the feedback signal may be made sufficiently good to permit the above described comparison of the termocouple voltage with the peak to center amplitude of the feedback signal, whereas if the amplified error signal were employed directly as the feedback signal, its wave shape would not be sufficiently good to permit such a comparison. This is because the error signal developed in the winding 101 is of extremely low level, in the order of microvolts, and noise voltages, switching transients, and other circuit disturbances affect this low level signal to a much greater extent than they would if the signal were of larger amplitude. These noise voltages, etc., also appear in highly amplified form in the output of the amplified error signal but are removed by filtering action when the amplified square wave error signal is converted to a D.C. voltage.

To provide this conversion of the amplified error signal into a corresponding D.C. voltage, the amplified square wave error signal appearing on the conductor 46 is transmitted through a condenser 150 to the collector of a transistor 151 the emitter of which is connected to ground. The square wave developed by the power supply 32 on the conductor 36 is coupled to the base of the transistor 151 through a resistor 152 so that the transistor 151 is rendered fully conductive on the negative half cycle portions of the square wave appearing on the conductor 36. During periods when the transistor 151 is rendered fully conductive the condenser 150 is connected to ground and charges to the value of the input square wave appearing on the conductor 46. However, during the non-conducting periods of the transistor 151 the condenser 150 charges a storage condenser 155 through a resistor 156 so that a substantially unidirectional potential is developed across the condenser 155. This substantially D.C. voltage is applied through a resistor 157 to the base electrode of a transistor 160 which is operated as a D.C. amplifier, the emitter of the transistor 160 being connected to ground and the collector of this transistor being connected to the −18 volt supply through a resistor 161. To obtain a further filtering and smoothing action another filter condenser 162 of relatively large value is connected between the collector of the transistor 160 and ground and the D.C. voltage developed across this condenser is impressed upon the conductor 50 as the D.C. output of the instrumentation amplifier 10.

In order to convert the D.C. voltage appearing on the conductor 50 into a corresponding square wave which will have good flat top portions and steep sides which may be employed as a suitable feedback signal in the input comparison circuit 11, the D.C. voltage appearing upon the conductor 50 is connected to the emitter of a series switching transistor 170 in the circuit 14, the collector of the transistor 170 being connected to an output coupling condenser 171 and to the collector of a shunt switching transistor 172. The emitter of the transistor 172 is connected to ground and the square wave signal generated by the power supply 32 on the conductor 36 is employed alternately to render the transistors 170 and 172 highly conductive so that the righthand side of the condenser 171 is first connected to the conductor 50 through the transistor 170 and is then connected to ground through the transistor 172 on alternate half cycles of the switching square wave. Thus, the square wave appearing on the conductor 36 is connected to the primary winding 175 of a switching transformer 176, having a center tapped secondary winding 177, the upper end of which is connected through a resistor 178 to the base electrode of the transistor 170 and the bottom end of which is connected through a resistor 179 to the base electrode of the transistor 172. The center tap of the winding 177 is connected to both collectors of the two transistors 170 and 172.

It will be noted that both of the transistors 170 and 172 are operated in the inverted form, i.e., the switching waveform is applied between the base and collector of the respective transistors so that a relatively low output impedance is obtained between the emitter and collector of the respective transistors when they are rendered fully conductive. Accordingly, on one half cycle of the square wave impressed upon the condenser 176 the transistor 170 will be rendered fully conductive so that the potential applied to the righthand side of the condenser 171 is substantially equal to the D.C. potential appearing on the conductor 50. At this time, the transistor 172 is turned completely off due to the oppositely polarized square wave applied between the collector and base thereof. During the next half cycle of the switching square wave the transistor 170 will be turned off and the transistor 172 will be rendered fully conductive so that the potential at the righthand side of the condenser 171 is equal to ground or common potential. It will thus be noted that a square wave having a peak to peak amplitude substantially exactly equal to the D.C. voltage produced on the conductor 50 is developed by the translating circuit 14 and is transmitted through the condenser 171 and over the conductor 44 to the winding 107 of the transformer 106 in the circuit 11. Furthermore, this square wave signal has extremely good flat top portions and steep sides due to the fact that the transistors 170 and 172 operate as extremely good electronic switches with only approximately one millivolt drop across these transistors when they are rendered fully conductive. Accordingly, the square wave signal appearing on the conductor 44 may be greatly reduced in magnitude in the feedback transformer 106 and still employed for comparison purposes with the thermocouple input voltage. The square wave voltage thus produced on the conductor 44 may be employed as the A.C. output of the instrumentation amplifier 10 and, in the illustrated embodiment this A.C. output is applied to the recorder 20, as will be described in more detail hereinafter.

The square wave signal which is developed on the conductor 36 in the power supply 32 is preferably generated by a suitable transistor switching arrangement which is itself energized from the —18 volt conductor 34 of the power supply 32. Preferably, the voltage developed on the conductor 34 is regulated by means of a suitable voltage regulator circuit in the power supply 32 so that changes in the line voltage applied to this power supply do not substantially affect the D.C. voltage appearing on the conductor 34. However, since the above described reference square wave which is supplied to the transformer windings 117 and 130 in the comparison circuit 11 is employed to provide fixed amplitude square wave components representing the zero suppression and cold junction compensation and these components are additively combined with the feedback square wave, it is essential that the reference square wave also has good wave shape, i.e., flat top portions and steep sides. Also, this reference square wave must be extremely stable in amplitude since it is employed to develop fixed amplitude square wave components which should not vary with line voltage and the like. Accordingly, it is necessary to provide further regulation of the square wave appearing on the conductor 36, it being understood that this square wave is already relatively stable in amplitude due to the fact that is is derived from a stabilized D.C. voltage in the power supply 32. Further regulation of the square wave appearing on the conductor 36 is provided by a circuit arrangement which is included in the comparison circuit 11. More particularly, the square wave appearing on the conductor 36 is coupled through a condenser 190 and a resistor 191 to the base electrode of a transistor 192, the collector of the transistor 192 being connected through a load resistor 193 to the —18 volt conductor 34. The emitter of the transistor 192 is connected to ground and a Zener diode 194 is connected between the collector of the transistor 192 and ground, a resister 195 being connected between the collector and base of the transistor 192 to provide a current path for the collector-base junction with the result that a low output impedance is provided across the transistor 192 when it is rendered fully conductive.

Figure 3A:
Figure 3B:
Figure 3C:

At this point it may be helpful to consider the waveform of the various square waves developed at different points in the circuit of the instrumentation amplifier 10. Considering first the square wave signal which is developed on the conductor 36 by the power supply 32, this waveform is shown in FIG. 3A as comprising the square wave 200 having a peak to peak amplitude of approximately 18 volts and having half cycles of equal duration. These half cycles have been arbitrarily labeled "1" and "2" so that the correct phase relationships may be established in the remainder of the circuitry, as will become more apparent from the following description. The square wave 200 is impressed upon the base of the transistor 192 in the circuit 11 and during the "2" half cycles of the square wave 200 the transistor 192 is rendered highly conductive so that the collector thereof is substantially at ground potential. During the opposite or "1" half cycles of the square wave 200 the transistor 192 is rendered non-cnoductive. However, the Zener diode 194 conducts as soon as the voltage at the collector of the transistor 192 decreases negatively to 5.6 volts and the Zener diode 194 holds the potential at the collector of the transistor 192 at —5.6 volts during each "1" half cycle of the square wave 200. Accordingly, there is produced at the collector of the transistor 192 a square wave 201 having the phase relationship shown in FIG. 3B and having a peak to peak amplitude of 5.6 volts. If the Zener diode 194 were employed by itself to provide a fixed amplitude square wave the trailing edge of the square wave would not be sharp due to the fact that the Zener diode does not have a sharp current conduction characteristic in the forward direction. However, when the transistor 192 is turned on during the negative or "2" periods of the square wave 200 the transistor 192 short circuits the diode 194 and provides a sharp trailing edge for the square wave 201 shown in FIG. 3B. The resistor 191 is included in the base circuit of the transistor 192 so that the square wave source which is connected to the conductor 36 will not short circuit the collector-base circuit of the transistor 192 during periods when the transistor 192 is rendered fully conductive.

The highly regulated square wave 201 is then coupled through a condenser 196 to the winding 117 on the transformer 116 and the winding 130 on the transformer 131. Considering first the switching transformer 131, the polarity of the regulated square wave 201 is reversed in the transformer 131 and a 2 to 1 step-up in amplitude of this square wave is achieved so that the square wave 202 shown in FIG. 3C of the drawings is produced across the winding 132 of the transformer 131. A portion of the square wave 202 is applied to the base-collector circuit of the electronic switch transistor 103 through the voltage divider 133, 134 and the transistor 103 is rendered fully conductive during the "2" half cycles of the square wave 202 as indicated by the nomenclature "on" beneath the "2" half cycles and the term "off" beneath the "1" half cycles of the square wave 202 in FIG. 3C.

Figure 3D:
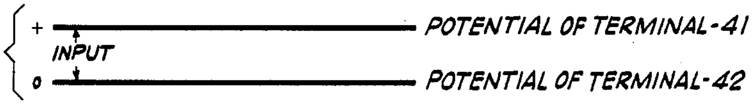
Figure 3E:
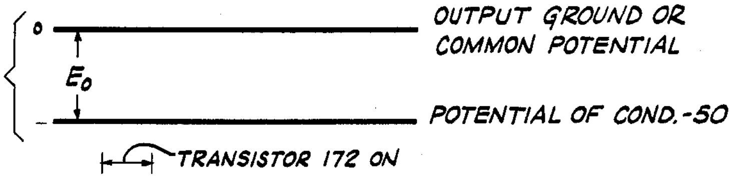

In FIG. 3D there is shown the D.C. input of the thermocouple 40, the potential of the terminal 42 being indicated as zero for reference purposes and the potential of the terminal 41 being positive with respect to this zero potential reference point. In FIG. 3E there is shown the D.C. output $E_0$ of the instrumentation amplifier 10 wherein the output ground or common potential is shown as zero and the potential of the conductor 50 is shown as a minus quantity. In this connection it will be understood that the zero potential reference point of FIG. 3D, i.e., the thermocouple input circuit, is isolated insofar as D.C. is concerned from the common output or ground potential zero of the output circuit as shown in FIG. 3E due to the above described transformer coupling arrangements provided in the circuit 11. Also, it will be understood that the magnitude of the thermocouple input shown in FIG. 3D will be in the order of millivolts, whereas the output voltage $E_0$ shown in FIG. 3E will vary from a minimum of —.4 volt at zero scale to a maximum of —2.0 volts at full scale.

Figure 3F:
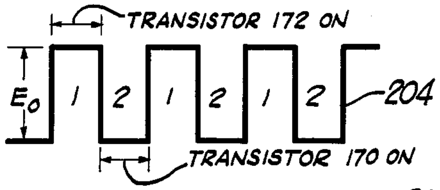

Considering now the switching waveforms involved in the translating circuit 14 whereby the D.C. potential on the conductor 50 is translated to a corresponding square wave of the same peak to peak value, the square wave 200 which appears on the conductor 36 is impressed upon the winding 175 of the transformer 176 and is repeated in like phase across the center tapped secondary winding 177 of this transformer. Accordingly, during the "1" half cycles of the square wave 200 the base of the transistor 172 is driven negatively so that this transistor is rendered highly conductive while, at the same time, the base of the transistor 170 is driven positive so that this transistor remains off. During the "2" half cycles of the square wave 200 the conditions are reversed and the transistor 170 is rendered fully conductive and the transistor 172 is turned off. Accordingly, the square wave 204 shown in FIG. 3F is developed on the conductor 44. As noted in FIG. 3F, during the "1" half cycles the transistor 172 is turned on and during the "2" half cycles the transistor 170 is turned on. The square wave 204 has a peak to peak amplitude equal to the $E_0$ output appearing on the conductor 50. As discussed heretofore, the square wave 204 has extremely flat top and bottom portions and steep sides so that this square wave may be employed in the input circuit 11 for comparison with the thermocouple input voltage.

As described generally heretofore, the square wave signal appearing upon the conductor 44 is used both as an A.C. output for the instrumentation amplifier 10 and as a feedback signal which is applied to the winding 107 of the feedback transformer 106. Considering now the polarities of the windings of the transformer 106 and the manner in which the feedback square wave appearing on the conductor 44 is compared to the D.C. input of the thermocouple 40, the winding 107 has a relatively large number of turns whereas the winding 108 has a relatively few number of turns and may have only as little as one-half turn depending upon the desired span of the instrumentation amplifier 10. More particularly, the turns ratio between the windings 107 and 108 is so chosen that each half turn of the span adjustment winding 108 represents a predetermined number of millivolts of input span. Thus, under the conditions described heretofore wherein the output span on the conductor 50 is 1.6 volts (from —.4 to —2.0 volts), let us assume that the winding 107 has 400 turns. This means that for an output span of 1600 millivolts (1.6 volts) each turn of the winding 108 will represent 4 millivolts of input span. However, it will be recalled that the comparison of the thermocouple output with the feedback square wave is made with respect to the peak to center value of the square wave rather than the peak to peak value of this square wave. Accordingly, each turn of the winding 108 will correspond to two millivolts of thermocouple input span and each half turn of the winding 108 will correspond to one millivolt of input span.

Figure 3G:
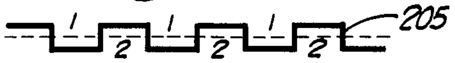
Figure 3H:
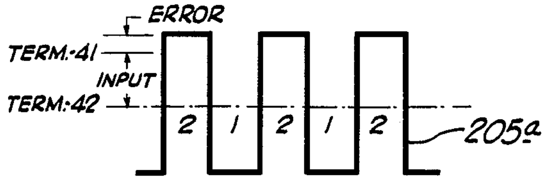
Figure 3I:
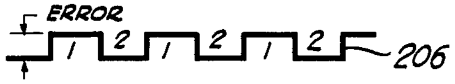

The square wave 204, which appears across the winding 107 is greatly reduced in amplitude by the above described turns ratio between the windings 107 and 108 and in addition the polarity of this square wave is reversed so that a square wave 205 shown in FIGURE 3G is produced across the winding 108, it being understood that the relative amplitudes of the square waves 204 and 205 are greatly distorted for purposes of illustration. It will be recalled that the electronic switch transistor 103 is turned on during the "2" half cycles of the square wave 202 shown in FIG. 3C and during the "2" half cycles the square wave 205 has a positive value. Accordingly, during the on periods of the electronic switch transistor 103 the positive output of the thermocouple 40 is compared with the positive peak to center value of the square wave 205 and the resultant difference between these two values appears as a square wave across the winding 101 of the output transformer 102. This set of conditions is shown in FIG. 3H wherein the D.C. input of the thermocouple 40 is shown in relation to the square wave 205, this square wave being drawn in FIG. 3H on a larger scale as the square wave **205*a*. As shown in FIG. 3H, the square wave 205*a* swings positively and negatively about the potential of the terminal 42 and the peak to center value of the square wave 205*a* is made just slightly larger than the thermocouple input appearing between the terminals 41 and 42. The resultant error voltage which appears across the winding 101 in the circuit 11 is thus the difference between the potential of the terminal 41 and the peak of the square wave 205*a* during the "2" half cycles as shown in FIG. 3H of the drawings. Since the square wave 205*a* is chosen to have a peak to center amplitude somewhat larger than the thermocouple input, the error voltage is negative so that the error square wave signal 206 shown in FIG. 3I is produced across the winding 101, it being noted that the "2" half cycles of the square wave 206 are negative going. The amplitude of the square wave 206 is, of course, the difference between the thermocouple input and the peak to center value of the square wave 205*a*. In this connection it will be understood that the square wave 205*a* in FIG. 3H is actually just a few microvolts larger than the thermocouple voltage and the error signal 206 has a peak to peak amplitude of only a few microvolts, this error signal being greatly magnified for purposes of illustration in FIGS. 3H and 3I. It will also be evident in FIG. 3H that the amplitude of the square wave 205*a* must be constant over the entire period when the transistor 103 is turned on, i.e., the square wave must have a flat top, in order to provide an arcuate comparison with the D.C. input voltage. Also, it will be evident that the positive half cycles of the square wave 205*a* must be accurately synchronized with respect to the conduction periods of the transistor 103 since otherwise switching transients and erroneous comparison of the input and feedback voltages will result. The square wave components produced by the zero suppression and cold junction compensation windings must be likewise accurately synchronized with the feedback square wave and the conduction periods of the transistor 103, and must also have flat top portions, so that the composite square wave signal impressed upon the collector of the transistor 103** will be suitable for comparison to the D.C. input voltage.

Figure 3J:

The square wave 206 is transmitted through the transformer 102 with the same polarity but with a slight step-up in amplitude for impedance matching purposes and the square wave 206 is then amplified in the square wave amplifier 12 so that there is produced on the output conductor 46 of this amplifier the square wave 207, it being understood that the amplitude of the square wave 207 is many times larger than the square wave 206. In the square wave demodulator circuit 13 the square wave 207 is applied to the condenser 150 and the transistor 151 is controlled in its conduction periods by the square wave 200 which appears on the conductor 36 and is applied to the base of the transistor 151 through the resistor 152. Accordingly, the transistor 151 is rendered conductive during the "2" half cycles of the square wave 207, as indicated in FIG. 3J. When the transistor 151 is rendered conductive it short circuits the righthand side of the condenser 150 to ground so that the succeeding or "1" half cycles of the square wave 207 will be negative with respect to ground. Accordingly, the condenser 155 is charged negatively through the resistor 156 so that an essentially D.C. voltage which is negative with respect to ground is produced across the condenser 155. This D.C. voltage is amplified in the D.C. amplifier transistor 160 so that a high level D.C. voltage is developed across the condenser 162 which forms the D.C. output of the instrumentation amplifier 10.

As stated heretofore, the D.C. output on the conductor 50 is translated in the circuit 14 into a square wave signal of corresponding peak to peak amplitude which is employed as a feedback signal and is coupled back through the transformer 106 to the input circuit wherein the thermocouple input voltage is compared to the positive peak to center value of the feedback square wave. This feedback signal is thus, in effect, a degenerative feedback signal which functions to reduce the overall gain between the input and the output of the amplifier 10. However, the signal gain in the forward direction through the amplifier 12 is so large that the error signal, i.e., the difference between the thermocouple input voltage and the peak to center feedback voltage, may be of the order of microvolts and still provide an output signal on the conductor 50 in the range from —.4 volt to —2.0 volts. It will thus be seen that the peak to center amplitude of the feedback signal produced across the winding 108 approaches the amplitude of the thermocouple input voltage but since the gain in the forward direction in the amplifier 10 is not infinite this feedback signal never exactly equals the input voltage so that a small error signal is always produced in the transformer winding 101. In this connection, it will be understood that the feedback signal may be made either slightly larger or slightly smaller than the thermocouple input voltage. However, if the feedback signal is chosen to be smaller than the input voltages the polarity of the error square wave 206 will be reversed and it will then be necessary to make a compensating change in the polarity of the signal at some other point in the circuit so that the feedback signal will remain degenerative, as will be readily understood by those skilled in the art.

Assuming that the operation of the circuit has stabilized at a particular thermocouple input voltage, if this input voltage decreases, it will be evident from FIG. 3H that the amplitude of the error signal will become larger. This larger error signal, which is then amplified in the square wave amplifier 12, is demodulated in the circuit 13 so that the voltage across the condenser 155 becomes more highly negative than it was before the thermocouple input voltage decreased. When the voltage across the condenser 155 is made more highly negative, the transistor 160 draws more current with the result that the voltage across the condenser 162 becomes less negative with respect to ground and the amplitude of the feedback square wave produced in the circuit 14 becomes smaller. This in turn reduces the error signal to a smaller value corresponding to the assumed smaller value of thermocouple input voltage and the circuit will stabilize at a point where the feedback signal is again slightly greater than the new thermocouple input voltage, this new error signal being somewhat smaller than previously so that the output signals on the conductors 50 and 44 are smaller by an amount corresponding to the decrease in thermocouple input voltage. It will thus be evident that the D.C. and A.C. outputs of the instrumentation amplifier 10 provide accurate representations of the thermocouple input voltage at relatively high voltage levels suitable for operating succeeding process control instruments.

In the comparison circuit 11, the square wave produced across the winding 108 is compared with the thermocouple input voltage and by adjustment of the number of turns on the winding 108 the span of the instrumentation amplifier 10 may be readily varied to accommodate the amplifier to different input span conditions.

However, it will be recalled that each one-half turn of the winding 108 is equivalent to one millivolt of input span. In order to change the calibration of the instrumentation amplifier 10 by a factor less than one millivolt of input span, i.e., by a factor less than one-half turn on the winding 108, the winding 105 is provided and the potentiometer 109 across this winding may be adjusted so as to give an additional increment of square wave signal so that the exact calibration to any given input span may be made. The winding 105 preferably comprises only a single turn and it will be evident that by adjustment of the potentiometer 109 any desired fraction of the two millivolt span represented by the winding 105 may be selected. In this connection it will be understood that the winding 105 may be phased in either polarity so that the square wave component produced across the winding 105 may either be added to or subtracted from the square wave signal developed across the winding 108.

As stated heretofore, the zero suppression transformer 116 is employed to produce a fixed amplitude square wave component, which is derived from a highly regulated square wave source, this square wave component being added to or subtracted from the feedback square wave signal appearing across the transformer winding 108 depending upon whether or not the zero of the instrument is to be suppressed or elevated. Specifically, the regulated square wave 201 (FIG. 3B) which is supplied to the winding 130 is also supplied to the winding 117 of the transformer 116 so that a corresponding square wave is produced across the windings 115, 120 and 125 of the transformer 116. As indicated heretofore, the square wave 201 has a peak to peak amplitude of 5.6 volts and the transformer winding 117 preferably has 1400 turns. Since the peak to center amplitude of the square wave 201 is 2800 millivolts (2.8 volts) it will be evident that each half turn of the winding 115 will produce a square wave having a peak to center value of one millivolt. Accordingly, the winding 115 is provided with the correct number of turns corresponding to the desired number of millivolts by which the instrument zero is to be suppressed or elevated. If the instrument zero is to be suppressed, the zero suppression winding 120 will have the same polarity as the winding 117, as indicated in FIG. 2A, so that a square wave component of a polarity similar to the square wave 201 shown in FIG. 3B will be produced across the winding 120. This square wave component will thus be of the same polarity as the feedback signal produced across the winding 108, as will be evident from a comparison of FIGS. 3B and 3G, so that the output voltage on the conductor 50 will not increase from its minimum scale value of —.4 volt until the thermocouple voltage reaches a predetermined level, this level being determined by the number of turns on the winding 117, i.e., the amplitude of the square wave component produced across the winding 117. On the other hand, if the instrument zero is to be elevated, as when a measuring instrument such as a strain gage is employed which produces zero output voltage at minimum scale whereas in the illustrated embodiment the instrumentation amplifier 10 produces —.4 volt at minimum scale, the polarity of the winding 117 will be reversed from that shown in FIG. 2A so that the square wave component produced across the winding 117 will subtract from the feedback square wave 205 (FIG. 3G) during the conduction periods of the transistor 103 and the peak to center amplitude of the composite square wave impressed upon the collector of the transistor 103 will be just a few microvolts larger than the assumed zero input voltage.

Since the number of turns on the winding 115 can be varied only by half turn increments, the winding 120 is provided with the potentiometer 121 thereacross, the winding 120 consisting preferably of only one turn so that a small increment of square wave signal can be added to the square wave signal produced across the winding 115. With this arrangement, the zero suppression point can be accurately obtained even though the desired zero suppression point is not an exact multiple of one-half a millivolt.

Considering now the function of the cold junction compensation winding 125, it will be evident that a square wave is produced across this winding having an amplitude proportional to the turns ratio between the windings 117 and 125. Preferably, the winding 125 has 153 turns when the winding 117 has 1400 turns so that a square wave having a peak to center amplitude of approximately 300 millivolts is produced across the winding 125. However, the manganin resistor 126 preferably has a value of 383 ohms, whereas the copper resistor 127 has a value of only 13.23 ohms so that the square wave actually produced across the copper resistor 127 has a peak to center value of only 15 to 20 millivolts due to the voltage division between the resistors 126 and 127. The square wave produced across the resistor 127 is employed to compensate for changes in the ambient temperature, i.e., the cold junction terminal 42 of the thermocouple 40 and hence this square wave is polarized to add to the voltage produced across the terminals 41, 42. Thus, the square wave appearing across the winding 125 is oppositely polarized from the square wave 205 shown in FIG. 3G. As the ambient temperature increases the temperature at the thermocouple cold junction goes up, and the input voltage between the terminals 41 and 42 decreases. However, since the resistance of the copper resistor 127 also increases with ambient temperature while the value of the resistor 126 remains constant, the voltage division between the resistors 126 and 127 changes and a larger square wave component is produced across the resistor 127 which exactly compensates for the decrease in thermocouple voltage produced between the terminals 41 and 42.

The above described number of turns of the winding 125 and resistances of the resistors 126 and 127 have been found satisfactory to produce cold junction compensation for a chromel-alumel type of thermocouple. When an iron-constantin thermocouple is employed, which produces a larger output that the chromel alumel thermocouple, it is necessary to provide a larger square wave component for cold junction compensation. To this end, an additional winding 125a, may be connected into the circuit by means of the switch 210 so that with the larger output of the iron-constantin thermocouple a larger square wave component of cold junction compensation signal will be produced across the copper resistor 127. Preferably the additional winding 125a has 45 turns so that with an iron-constantin thermocouple the windings 125 and 125a have a total of 198 turns.

As described heretofore, the square wave component produced across the resistor 127 is oppositely polarized from the square wave produced across the feedback winding 108 so that the square wave component across the resistor 127 in effect adds to the thermocouple output voltage appearing between the terminals 41 and 42. However, the square wave component produced across the resistor 127 would in most instances produce an undesired zero offset. The zero suppression winding 115 has the further function of compensating for any undesired zero offset produced by the cold junction square wave component so that the instrumentation amplifier 10 provides the required minimum scale output with a predetermined thermocouple input signal. Thus, if the square wave component across the resistor 127 has a peak to center amplitude of 15 millivolts, the winding 115 may have 7.5 turns just to compensate for the zero offset produced by this square wave component and even if no other suppression or elevation of the instrument zero is required. In this connection, it will be understood that the amplitude of the square wave component produced across the winding 115 does not vary with ambient temperature. Accordingly, even though the zero suppression square wave across the winding 115 exactly cancels the square wave component produced across the resistor 127 at a certain predetermine temperature, as the ambient temperature increases the square wave component across the resistor 127 will increase while the square wave component across the winding 115 remains constant so that the net effect is to introduce a square wave component into the input circuit 11 which is added to the thermocouple input voltage and increases as the thermocouple input voltage decreases so as to provide cold junction compensation.

Considering now the component units of the recorder 20, the square wave output signal produced on the conductor 44 is employed as a recorder input signal to control the position of the recording pen 24 of the recorder 20. The recorder 20 employs an electrical null balance system wherein the input square wave is compared with a square wave representing the actual position of the recording pen and the resultant error signal is employed to position the pen for a minimum error or null. Considering first the manner in which the position of the recording pen 24 is translated into a square wave having an amplitude corresponding to pen position, the stator windings 77 and 78 of the translating unit 30 are supplied with the highly regulated square wave 201 shown in FIG. 3B so that a corresponding magnetic field is set up across the rotor 75 with the result that the rotor winding 79 has induced therein a square wave signal the amplitude of which varies with the position of the rotor 75 relative to the stator. Preferably, both the rotor and stator of the unit 30 are of laminated construction and are made of magnetic material having very high initial permeability so that the square wave induced in the rotor winding 79 has relatively steep sides and flat top portions. When the recording pen is at mid scale and rotor 75 is in the position shown in FIG. 2B the square wave signal induced in the rotor winding 79 has a value midway between its minimum and maximum values, and this square wave signal is combined with the square wave component produced across the potentiometer 81 and the resistor 82. This composite square wave is compared with the input signal on the conductor 44 by means of the mixing circuit which includes the resistors 66 and 86 and the resultant error signal is amplified in the square wave amplifier 22. The amplifier 22 may comprise a series of three transistor stages substantially identical to the square wave amplifier 12 described in detail above, and the amplified error signal which appears upon the conductor 58 is coupled through the condensers 220 and 221 to the collectors of the transistors 222 and 223, respectively. The emitters of the transistors 222 and 223 are connected to ground so that when the transistor 222 is rendered conductive it functions to short circuit the condenser 220 to ground and when the transistor 223 is rendered conductive it functions to short circuit the condenser 221 to ground. The square wave 200 (FIG. 3A) which is produced on the conductor 36 is coupled through a transformer 225 to the base circuits of the transistors 222 and 223 so that these transistors are alternately rendered conductive. Accordingly, if the error signal on the conductor 58 is of one phase the transistor 222 will function to demodulate the error signal so that a unidirectional voltage of one polarity is produced across the output condenser 226 and the transistor 223 functions to demodulate the error signal so that a unidirectional voltage of the opposite polarity is produced across the output condenser 227. On the other hand, if the error signal is of the opposite phase the transistors 222 and 223 will function to reverse the polarities of the signals developed across the condensers 226 and 227. The diodes 228 and 229 are connected between the respective transistors and their associated output condensers so that a voltage doubler action is provided whereby the output voltage across the condensers 226 and 227 is substantially increased.

The unidirectional voltages appearing across the condensers 226 and 227 are amplified in the output transistors 230 and 231, respectively, the collector of the transistor 230 being connected to one end of the rotor winding 63 and the collector of the transistor 231 being connected to one end of the rotor winding 64, the other ends of the windings 63 and 64 being connected to the −18 volt supply terminal. The emitters of the transistors 230 and 231 are connected through a common resistor 240 to ground so that in the absence of any voltages developed across the condensers 226 and 227 the transistors 230 and 231 are drawing very little current and the rotor 70 occupies the midposition shown in FIG. 2B. If the error signal on the conductor 58 is of one polarity the voltage across the condenser 226 will increase negatively so that the transistor 230 draws more current while at the same time the voltage across the condenser 227 increases positively. However, this positive increase in voltage across the condenser 227 has little effect since it merely causes the transistor 231 to cease conducting. The net result is that the current in the rotor winding 63 increases substantially so that a magnetic field is set up which moves the rotor 70 in one direction from its midposition. If the error signal is of the opposite phase the voltages developed across the condensers 226 and 227 are reversed in polarity so that the transistor 231 draws more current and a field is set up by the rotor winding 64 which moves the rotor 70 in the opposite direction. It will, of course, be understood that the phase of the error signal will vary depending upon whether the input signal is larger than the feedback signal or is smaller than the feedback signal and the system will act to position the pen 24 in accordance with the amplitude of the square wave input signal on the conductor 44. A diode 235 is connected between the conductor 34 and the collector of the transistor 230 and a diode 236 is connected between the collector of the transistor 231 and the conductor 34. The diodes 235 and 236 are provided for the purpose of suppressing inductive transients which might be set up in the rotor windings 63 and 64 and would tend to damage the transistors 230 and 231.

While particular embodiments of the invention have been shown, it will be understood, of course, that it is not desired that the invention be limited thereto since modifications may be made, and it is, therefore, contemplated by the appended claims to cover any such modifications as fall within the true spirit and scope of the invention.

What is claimed as new and is desired to be secured by Letters Patent of the United States is:

1. An instrumentation amplifier comprising a pair of input terminals adapted to be connected to a D.C. input signal source, a feedback transformer having a primary and a secondary winding, the primary winding of the feedback transformer having a square wave feedback signal applied thereto, means including the secondary winding of the feedback transformer for comparing the amplitude of the D.C. input signal with the square wave feedback signal induced across the secondary winding of the feedback transformer to derive a square wave error signal proportional to the difference therebetween, means for amplifying the square wave error signal, means for demodulating the square wave error signal to derive an amplified unidirectional voltage proportional to the D.C. input signal, modulating means for converting the unidirectional voltage into said square wave feedback signal and applying said square wave feedback signal to the primary winding of the feedback transformer, the feedback transformer having a high turns ratio between the primary and secondary windings with the primary winding having a number of turns of at least one order of magnitude greater than the number of turns of the secondary winding to permit the square wave feedack signal to be formed by the modulating means from the amplified unidirectional output signal to provide a high signal to noise ratio in the square wave feedback signal and to permit the input span of the amplifier to be varied appreciably by changing the number of turns in the secondary winding by one turn.

2. An instrumentation amplifier comprising a pair of input terminals adapted to be connected to a DC input signal source, a feedback transformer having a primary and a secondary winding, the primary winding of the feedback transformer having a squave wave feedback signal applied thereto, a zero suppression transformer having a primary and a secondary winding, means for applying a square wave reference signal of predetermined amplitude to the primary winding the of the zero suppression transformer, means including the secondary windings of the feedback and zero suppression transformers for comparing the combined amplitudes of the D.C. input signal and the signals induced across the secondary windings of the feedback and suppression transformers to derive a square wave error signal, means for amplifying the square wave error signal, means connected to the error signal amplifying means for developing an output signal for the amplifier and for producing the square wave feedback signal and means for applying the square wave feedback signal to the primary winding of the feedback transformer, the zero suppression transformer having a high turns ratio between the primary and secondary windings with the primary winding having a number of turns of at least one order of magnitude greater than the number of turns of the secondary winding to permit the square wave reference signal to be formed with a high peak-to-peak amplitude to provide a high signal to noise ratio and to permit the zero suppression point of the amplifier to be varied appreciably by changing the number of turns of the secondary winding of the zero suppression transformer by one turn.

3. An instrumentation amplifier comprising a pair of input terminals adapted to be connected to a D.C. input signal source, a feedback transformer having a primary and a secondary winding the primary winding of the feedback transformer having a square wave feedback signal applied thereto, a zero suppression transformer having a primary and secondary winding, means for applying a square wave feedback signal of predetermined amplitude to the primary winding of the zero suppression transformer, comparison means for comparing the combined amplitudes of the D.C. input signal and the signals induced across the secondary windings of the feedback and suppression transformers to derive a square wave error signal, means for amplifying the square wave error signal, means connected to the amplifying means for developing an output signal for the amplifier and for producing the square wave feedback signal, means for applying the square wave feedback signal to the primary winding of the feedback transformer, the feedback transformer having a high turns ratio between the primary and secondary windings with the primary winding having a number of turns of at least one order of magnitude greater than the number of turns of the secondary winding thereof, the zero suppression transformer having a high turns ratio between the primary and secondary windings with the primary winding having a number of turns of at least one order of magnitude greater than the number of turns of the secondary winding thereof.

4. The combination as defined in claim 3 wherein the zero suppression transformer includes an auxiliary winding and a temperature responsive element connected in series circuit relationship with the secondary winding of the zero suppression transformer for supplying a square wave signal from said auxiliary winding to said comparison means, the amplitude of which varies with the ambient temperature to compensate for changes in said input signal due to ambient temperature variations.

5. An instrumentation amplifier comprising a pair of input terminals adapted to be connected to a direct current input signal source, a feedback transformer having a primary and a secondary winding, the primary winding of the feedback transformer having a square wave feedback signal applied thereto, a zero suppression transformer having a primary, a secondary and an auxiliary winding, means for applying a square wave reference signal of a predetermined amplitude to the primary winding of the zero suppression transformer, temperature responsive means connected to the auxiliary winding of the zero suppression transformer for producing a signal which varies with temperature to compensate for changes in the input signal due to ambient temperature variations, switching means coupled to input terminals and responsive to the direct current input signal, the signals induced across the secondary windings of the feedbock and zero suppression transformers and the signal produced by the temperature responsive means for producing a square wave error signal, means for amplifying the square wave error signal, means connected to the error signal amplifying means for developing an output signal for the amplifier and for producing said square wave feedback signal and means for applying said square wave feedback signal across the primary winding of the feedback transformer.

6. An instrumentation amplifier, comprising a pair of input terminals adapted to be connected to a D.C. input signal source, a feedback transformer having primary and secondary windings, said primary winding of the feedback transformer having a feedback signal supplied thereto, an error signal transformer having primary and secondary windings, a zero suppression transformer having primary and secondary windings, means for supplying a square wave reference signal of predetermined amplitude to said primary winding of said zero suppression transformer, means for periodically connecting the secondary winding of said feedback transformer, the secondary winding of said zero suppression transformer and the primary winding of said error signal transformer in series relationship across the input terminals so that an error signal is produced in said primary winding of said error signal transformer which is proportional to the difference between the amplitude of said D.C. input signal and the combined amplitudes of the feedback signal appearing across the secondary of said feedback transformer and the reference signal appearing across the secondary of said zero suppression transformer, means connected to said secondary winding of said error transformer for amplifying said error signal, means connected to said error signal amplifying means for developing an output signal for said amplifier and for producing said feedback signal, and means for applying said feedback signal across said primary winding of said feedback transformer.

7. The combination as defined in claim 6 wherein the feedback transformer includes a third winding and means for coupling a predetermined portion of the feedback signal induced across said third winding in series relationship with the secondary winding of the feedback transformer and wherein the zero suppression transformer includes a third winding and means for coupling a predetermined portion of the signal induced across the third winding in series relationship with the secondary winding of the zero suppression transformer.

8. The combination as defined in claim 6 wherein the zero suppression transformer includes an auxiliary winding and including a temperature responsive means for coupling a predetermined portion of the signal induced across said auxiliary winding in series relationship with the secondary winding of the zero suppression transformer to compensate for changes in the input signal due to ambient temperature variations.

References Cited by the Examiner

UNITED STATES PATENTS

| | | | |
|---|---|---|---|
| 2,779,870 | 1/1957 | Henry et al. | 328—146 |
| 2,910,563 | 8/1959 | McAdams et al. | 330—9 |
| 2,953,752 | 9/1960 | Porter | 330—9 |
| 3,014,135 | 12/1961 | Hewlett et al. | 330—10 X |
| 3,046,417 | 7/1962 | Garcia | 328—146 X |

FOREIGN PATENTS

| | | |
|---|---|---|
| 646,647 | 11/1950 | Great Britain. |

ROY LAKE, *Primary Examiner.*

ELI J. SAX, NATHAN KAUFMAN, *Examiners.*